United States Patent
Jeon et al.

(10) Patent No.: US 7,391,075 B2
(45) Date of Patent: Jun. 24, 2008

(54) NON-VOLATILE SEMICONDUCTOR MEMORY DEVICE WITH ALTERNATIVE METAL GATE MATERIAL

(75) Inventors: Sang-hun Jeon, Seoul (KR); Jeong-hee Han, Suwon-si (KR); Chung-woo Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 18 days.

(21) Appl. No.: 11/246,114

(22) Filed: Oct. 11, 2005

(65) Prior Publication Data

US 2006/0118858 A1 Jun. 8, 2006

(30) Foreign Application Priority Data

Oct. 8, 2004 (KR) .................... 10-2004-0080354

(51) Int. Cl.
*H01L 29/788* (2006.01)
(52) U.S. Cl. .................... 257/316; 257/324; 257/412; 257/E29.3
(58) Field of Classification Search ............ 257/321, 257/324, 412, E29.3, E29.309, 315, 316
See application file for complete search history.

(56) References Cited

U.S. PATENT DOCUMENTS 6,509,282 B1    1/2003   Ngo et al.
2003/0234420 A1* 12/2003 Forbes ...................... 257/315
2005/0270849 A1* 12/2005 Lue ........................ 365/185.28
2006/0022252 A1*  2/2006 Doh et al. ................. 257/314
2006/0245245 A1* 11/2006 Mokhlesi et al. ........ 365/185.01

OTHER PUBLICATIONS

E. Cartier et al., "Systematic study of pFET $V_t$ with Hf-based gate stacks with poly-Si and FUSI gates", VLSI 2004-VLSI Technology/Circuits Symposium, IEEE, Jun. 2004, pp. 44-45.
Alex Zunger, "Practical Doping Principles", National Renewable Engergy Laboratory, Golden, Colorado, 80401, NREL/CD-520-33589, pp. 831-835., 2003.

* cited by examiner

*Primary Examiner*—T. N. Quach
(74) *Attorney, Agent, or Firm*—Buchanan Ingersoll & Rooney PC (57) ABSTRACT

A non-volatile semiconductor memory device comprises a substrate including a source region, a drain region and a channel region provided between the source region and the drain region with a gate stack located above the channel region with a metal gate located above the gate stack. The metal gate is comprised of a metal having a specific metal work function relative to a composition of a layer of the gate stack that causes electrons to travel through the entire thickness of the blocking layer via direct tunneling. The gate stack preferably comprises a multiple layer stack selected from a group of multiple layer stacks consisting of: ONO, ONH, OHH, OHO, HHH, or HNH, where O is an oxide material, N is SiN, and H is a high κ material.

5 Claims, 9 Drawing Sheets

NON-VOLATILE SEMICONDUCTOR MEMORY DEVICE WITH ALTERNATIVE METAL GATE MATERIAL

CROSS-REFERENCE TO RELATED PATENT APPLICATION

Priority is claimed to Korean Patent Application No. 10-2004-0080354, filed on Oct. 8, 2004, in the Korean Intellectual Property Office, the disclosure of which is incorporated herein in its entirety by reference.

FIELD OF THE INVENTION

The present invention relates to non-volatile semiconductor memory devices including charge trap flash memory and floating gate flash memory devices, as well as to methods of making non-volatile semiconductor memory devices.

DESCRIPTION OF RELATED ART

Non-volatile memory devices are electronic memory devices that retain their content when external power is removed. Semiconductor non-volatile memory devices typically include a charge trapping layer in which charges are trapped between a gate and a channel region of a transistor. The trapped charges create a threshold voltage difference in the channel region. The threshold voltage $V_{th}$ varies depending on whether the non-volatile memory device is in the program state wherein charges are injected into the charge trapping layer, or in an erase state wherein electrons leave the charge trapping layer. This in turn varies the gate voltage ($V_{th}$) level for allowing current to conduct through the channel. As can be seen, operation of non-volatile semiconductor memory devices are realized by the concept of the threshold voltage $V_{th}$ being varied by charges trapped in or stored in a charge trapping layer.

One type of non-volatile memory devices is flash memory. Flash memory devices can be further divided into floating gate flash memory and charge trap flash memory. In floating gate memory devices, a floating gate of a metal layer or a metal-like layer has been used as the charge storage layer. In charge trap memory devices, such as in semiconductor-oxide-nitride-oxide-semiconductor (SONOS) memory devices, a charge trapping dielectric layer is used.

Essentially, the memory SONOS cells is a conventional NMOS transistor, but with a gate dielectric of a thermal oxide layer of around 2 nm thickness, a silicon nitride layer of about 5 nm thickness and a second oxide layer with a thickness of between 5 and 10 nm. At a positive gate bias, electrons can tunnel from the substrate through the ultra thin oxide layer (an exemplary tunneling layer) to the nitride layer (an exemplary charge trapping layer) where they are subsequently trapped. Silicon nitride, for example, has an intrinsic property of trapping electrons. Due to the trapped and negative charge, the threshold voltage of the transistor increases. Likewise, the threshold voltage can be decreased with a negative voltage on the gate, thereby expelling electrons from the nitride layer. Thus, the SONOS-type memory cell is one type of charge trap flash memory device where the data state of the memory cell can be determined by the operational characteristics due to the amount of charge stored in the charge trapping layer.

A drawback of these types of memory devices results from a characteristic relatively poor erasing efficiency that prevents them from meeting backwards compatibility requirements of a $10^{-3}$ second erasing time at around −3 volts for the threshold voltage $V_{th}$ (V)). The known charge trap flash memory devices have this problem by reason of electrons back tunneling through the blocking layer. Electronic back tunneling causes the erase threshold voltage $V_{th}$ to not drop off sufficiently or sufficiently quickly in known SONOS devices. For example, the erase threshold voltage $V_{th}$ state in known devices typically should drop from about 1 volt to about −3 volts during the desired erase time of about $10^{-3}$ seconds. The erase threshold voltage $V_{th}$ state that may continue to drop or even may increase, especially when the gate bias is about −17 volts to a −15 volts.

As the design rules for non-volatile memory devices decrease substantially, particularly with reference to smaller size cells, it is more important to improve erase efficiency. To improve the erase efficiency, the present inventors have explored improving electron back tunneling characteristics that contribute to the degradation of the erase efficiency.

During an erase operation, as a voltage is applied to the gate, a back tunneling of electrons located between the gate and charge trapping layer are moved from the gate to the charge trapping layer. This back tunneling means that electrons are provided to the charge trapping layer from the control gate thereby reducing or slowing the drop in population of electrons, resulting in lengthened erase operation and otherwise lowering the erase efficiency.

Figure 1:
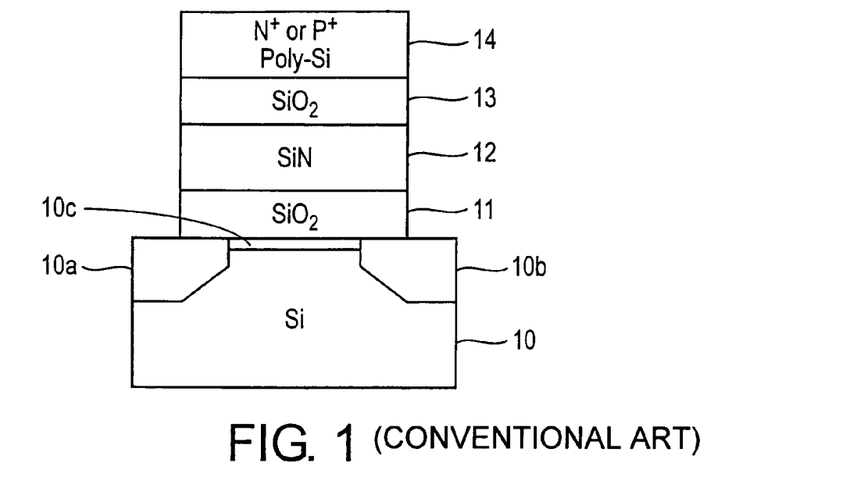
FIG. 1 illustrates a conventional non-volatile memory structure.

FIG. 1 schematically illustrates a non-volatile ONO stack flash memory device. It includes a silicon substrate 10 having a source region 10a and a drain region 10b with a channel region 10c located therebetween. Above the channel region 10c is a dielectric layer 11 of silicon dioxide $SiO_2$ ("O"), a charge trapping layer 12 of silicon nitride SiN ("N") and another dielectric layer ("O") of $SiO_2$ for example as the blocking layer 13. The control gate 14 includes either $N^+$ polysilicon with a work function of 4.1 eV or $p^+$ polysilicon with a work function of 5.1 eV, in this example. See, U.S. Pat. No. 6,509,282. Polysilicon is used as a control gate rather than metal because of the propensity of silicon dioxide to form silicide when exposed to metal. That is, the combination of metal and silicon tends to be unstable.

Figure 2:
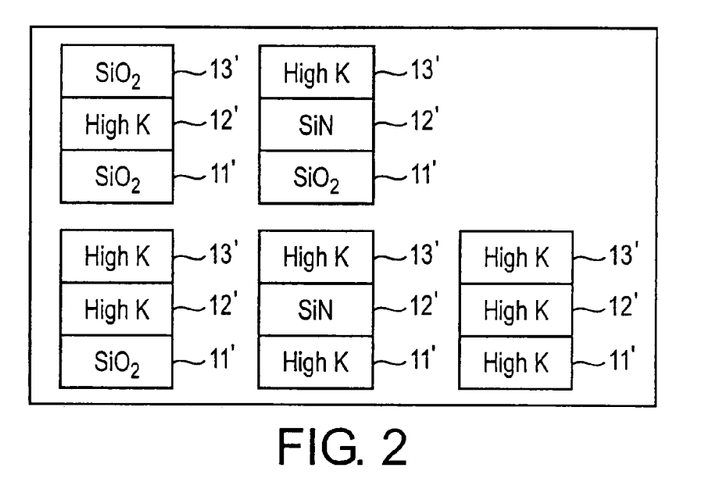
FIG. 2 illustrates variations on the non-volatile memory structure of FIG. 1 with reference to the gate stack.

FIG. 2 illustrates several SONOS type flash memory structures that have relatively thick high κ dielectric layers to purportedly achieve better programming.

Figure 3:
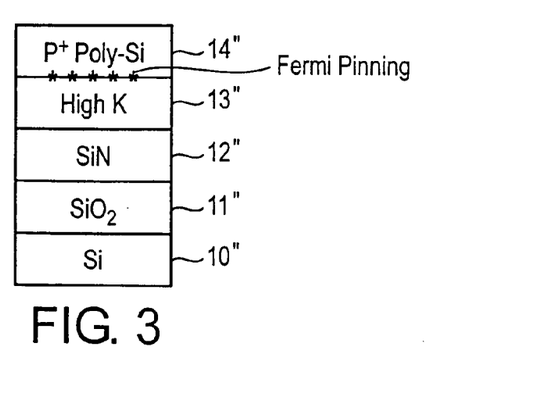
FIG. 3 illustrates a polisilicon/$HfO_2$ stack structure.

FIG. 3 illustrates a hybrid of the first two figures as to the polysilicon-$HfO_2$ (high κ material) stack. As reported in E. Cartier et al., "Systemic Study of pFET Vt with Hf-Based Gate Stacks with Poly-Si and FUSI Gates," VLSI 2004-VLSI Technology/Circuits Symposium, IEEE, June, 2004, the perceived problem with this structure is the apparent effect of Fermi level pinning in the $HfO_2$.

Figure 4:
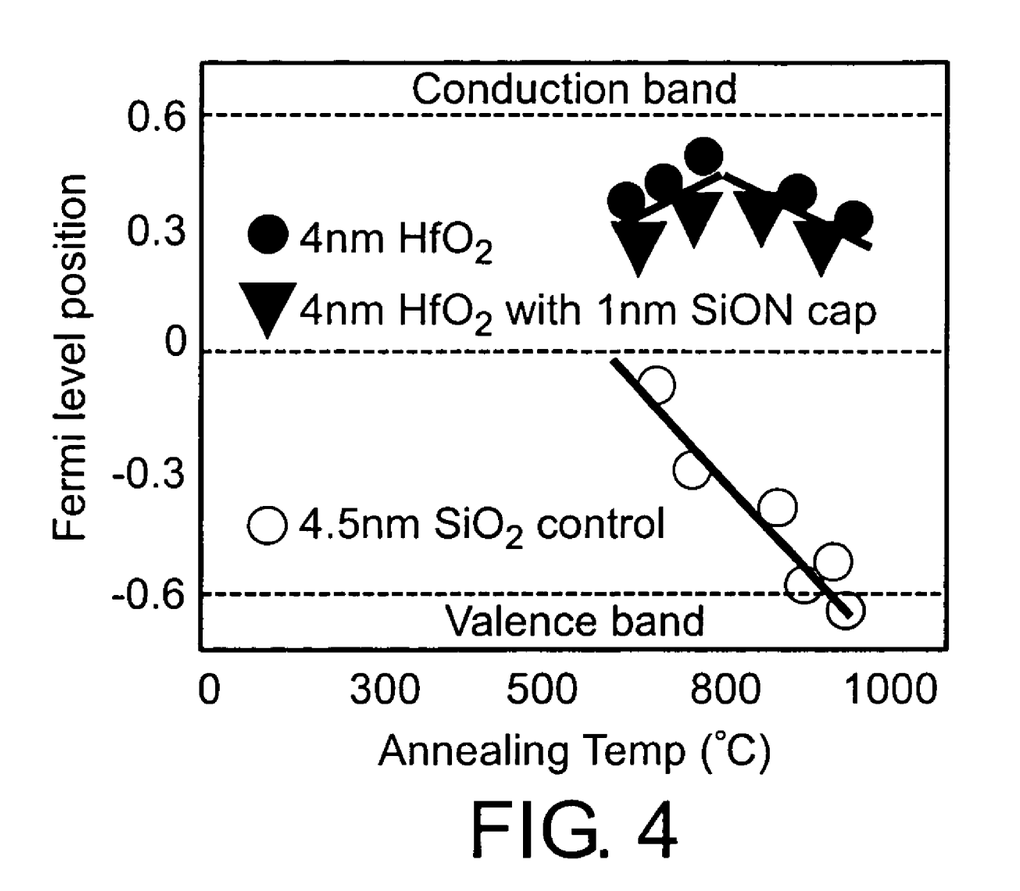
FIG. 4 illustrates a problem as to why the conventional structure of FIG. 3 may not work.

As illustrated in FIG. 4, the Fermi level position varies for the 4.5 nm $SiO_2$ according to annealing temperature but not so for the high κ materials $HfO_2$ of 4 nm or 4 nm of $HfO_2$ with 1 nm SiON. As the annealing temperature of a 4 nm thick layer of $HfO_2$ is increased from about 600 degrees C. to about 1000 degrees C., the Fermi level position of p+ poly silicon initially increases from about 0.3 to about 0.4 or 0.5 and then decreases back to about 0.3. A 4.5 nm layer of silicon dioxide at the same annealing temperatures has a Fermi level position that decreases from about 0 (the intrinsic level) to about −0.6, which is the original value of p+ poly-Si gate.

Accordingly, materials with high κ are not compatible with a gate that is formed of p+ poly-silicon regardless of the annealing temperature used for the material because of the back tunneling effect. The back tunneling effect results in relatively poor erasing efficiency. It thus appears that Fermi level pinning occurs interferes in this structure at least with respect to its usefulness in a charge trapping dielectric non-volatile memory device. Hence, there is still a need for reducing back tunneling through the blocking dielectric in floating gate-type and charge trap-type non-volatile memory devices.

SUMMARY OF THE INVENTION

The present invention provides a method of manufacturing a non-volatile memory device with a control metal gate having a work function which effectively offers a relatively large barrier height so that electron back tunneling through the blocking dielectric is effectively suppressed.

One exemplary embodiment of the present invention is a non-volatile semiconductor memory device which includes a substrate having a source region, a drain region and a channel region provided between the source region and the drain region. A gate stack located above the channel region includes a sequential stack of a tunnel layer, a charge trapping layer, a blocking layer and a control gate, wherein the tunnel dielectric is adjacent to the channel region. The control gate is metal gate comprised of a metal having a specific metal work function equal or greater than 4.4 eV when the blocking layer includes $SiO_2$.

This type of non-volatile semiconductor memory device can be a floating gate memory device wherein the charge trapping layer is a floating gate. Alternatively. The non-volatile semiconductor memory device can be a charge trap flash memory device wherein the charge trapping layer is a charge trapping dielectric.

Exemplary embodiments include a gate stack comprises a multiple layer stack selected from a group of multiple layer stacks consisting of: $O/SiN/SiO_2/M$, $O/H/SiO_2/M$, $H/H/SiO_2/M$, or $H/SiN/SiO_2/M$, where O is an oxide material, H is a high κ material and M is a metal having the specific work function.

In still another exemplary embodiment. The non-volatile semiconductor memory device includes a substrate having a source region, a drain region and a channel region provided between the source region and the drain region, as in the first embodiment. It also includes a gate stack located above the channel region, wherein the gate stack has a sequential stack of a tunnel layer, a charge trapping layer, a blocking layer and a control gate, wherein the tunnel dielectric is adjacent to the channel region. The control gate is metal gate comprised of a metal having a specific metal work function in the range of equal or greater than 4.9 eV to equal or less than 5.5 eV, when the blocking layer is a high κ dielectric having a dielectric value above 4.2. This device can be a floating gate memory device with a floating gate type charge trapping layer, or a charge trap flash memory device with a charge trapping dielectric layer.

In this variation of the present invention, the gate stack comprises a multiple layer stack selected from a group of multiple layer stacks consisting of: O/N/O/M, O/N/H/M, O/H/H/M, O/H/O/M, H/H/H/M, or H/N/H/M, where O is an oxide material, N is SiN, H is a high κ material having a dielectric value above 4.1 and M is a metal having the specific work function.

In yet another aspect of the present invention, a floating gate non-volatile semiconductor memory device includes a substrate having a source region, a drain region and a channel region provided between the source region and the drain region. A gate stack is located above the channel region wherein the gate stack includes a sequential stack of a tunnel layer, a floating gate layer, a blocking layer and a control gate and the tunnel dielectric is adjacent to the channel region. In this aspect, the control gate is a metal gate comprised of a metal having a specific metal work function in the range of equal or greater than 4.9 eV to equal or less than 5.5 eV, when the tunnel layer is a high κ dielectric.

An example of this aspect of the invention includes a gate stack having a multiple layer stack selected from a group of multiple layer stacks consisting of: H/N/O/M, H/N/H/M, H/H/H/M, or H/H/O/M where O is an oxide material, N is SiN, H is a high κ material and M is a metal having the specific work function.

BRIEF DESCRIPTION OF THE DRAWING FIGURES

The above, and other features and advantages of the present invention, will become more readily apparent by the following description of exemplary embodiments, to which the present invention is not limited, with reference to the attached drawings.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 5:
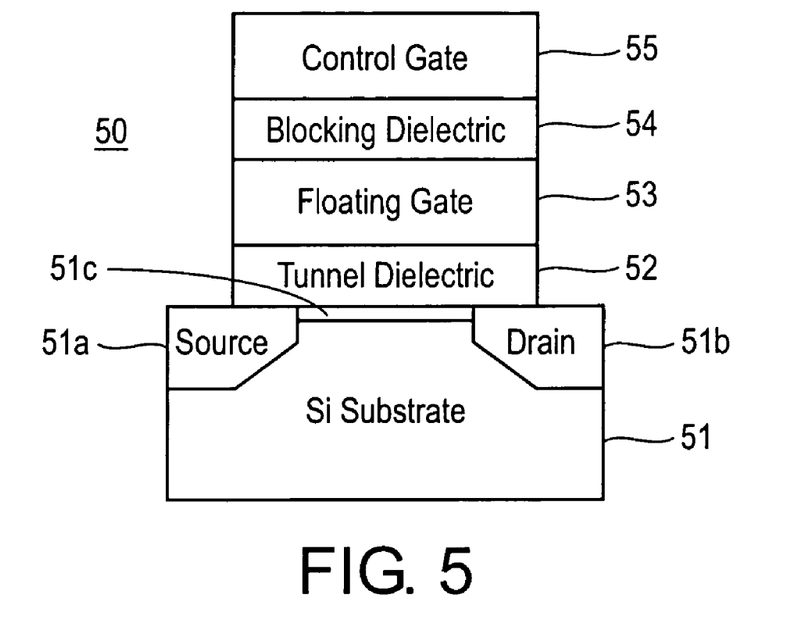
FIG. 5 illustrates an exemplary floating gate stack non-volatile memory device.

FIG. 5 illustrates a floating gate stack-type non-volatile memory 50, which includes a substrate 51 made of, for example, silicon. Other materials for the substrate 51 can be used, but silicon is currently the most common. In the substrate 51 are formed a source 51a and a drain 51b between which is formed a channel region 51c. It should be noted that, in this instance, the term "substrate" should be interpreted broadly to include wafers or other forms of substrates whether rigid or flexible, and also including embodiments in which various additional layers have been deposited or grown. The substrate 51 and source, drain and channel regions 51a-51c can be formed in any suitable manner.

Above the channel region 51c is formed the gate stack 56. The gate stack 56 includes, in sequence away from the substrate 50, a tunnel layer 52, a charge trapping layer 53, a blocking layer 54, and a control gate 55. In the floating gate stack 56 shown in FIG. 5, the charge trapping layer 53 is a floating gate made of a conductive material such as metal or a metal-like material. The tunnel layer 52 is a dielectric and the blocking layer 54 is also a dielectric. The frequency of electrons tunneling from the control gate 55 to the floating gate 53 is controlled by the charge blocking dielectric 54.

The charge blocking dielectric 54 is preferably formed of a material having a high dielectric constant κ, for example, an insulator. By considering energy bands at junction structures of the metal of the control gate 55, the dielectric material of the blocking layer 54 and the floating gate forming the charge trapping layer 53, the effect of increasing the work function of the metal gate layer 55 in increasing the barrier height of the blocking layer can be understood, as explained with reference to FIGS. 7(a) and 7(b), below.

Figure 6:
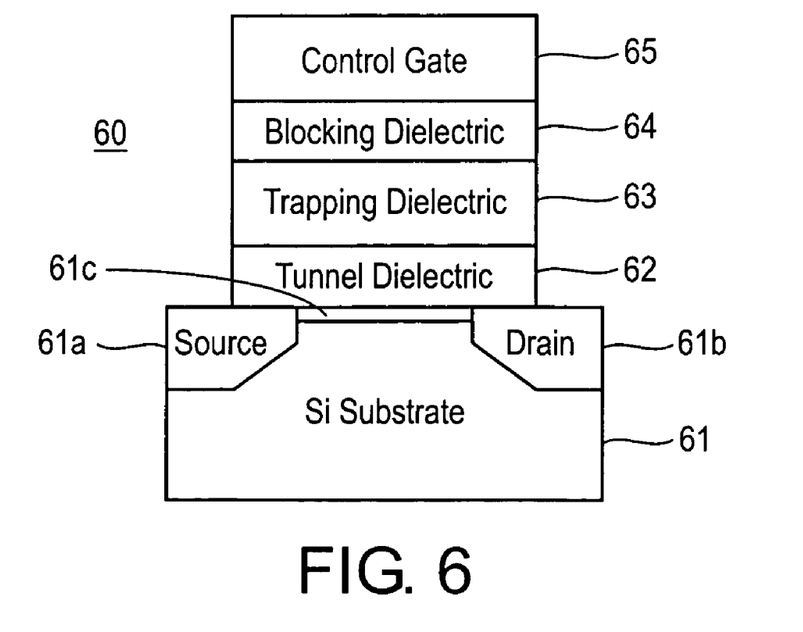
FIG. 6 illustrates an exemplary charge trap flash memory non-volatile memory device.

FIG. 6 has a similar structure to the memory device 50 of FIG. 5, but is representative of a charge trap flash non-volatile memory device 60. Like the embodiment of FIG. 5, the substrate 61 can be made of silicon, for example, or other suitable substrate materials. A source 61a and a drain 61b in the substrate 61 form a channel region 61c there between. A gate stack 66 is formed over the channel region 61c. The gate stacking 66 includes, in sequence, a tunnel layer 62, a charge trapping layer 63 in the form of a dielectric, a blocking layer 64, and a control gate 65. However, if the tunnel layer 62 comprises a high-k material, then the floating gate should be a high work-function metal or metal like material.

Figure 8:
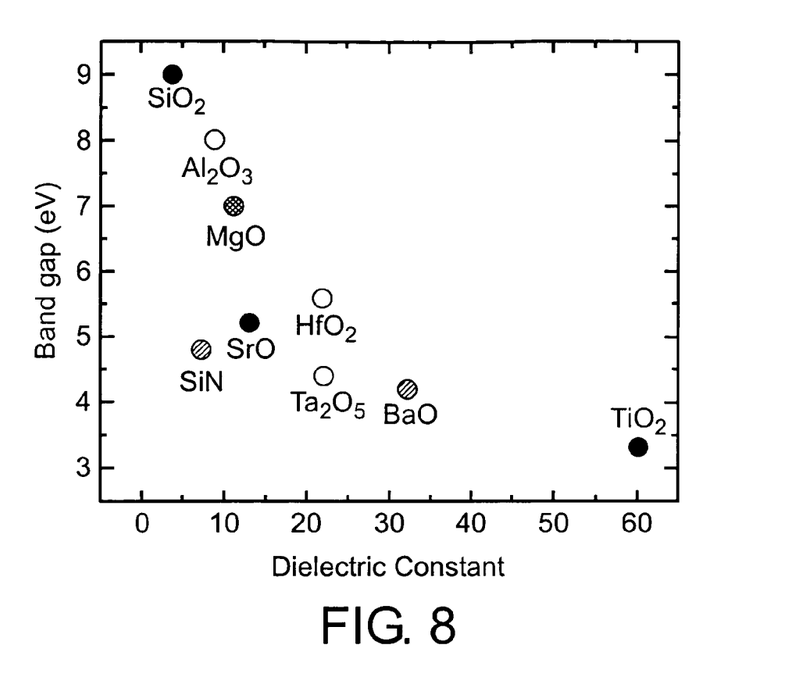
FIG. 8 illustrates the band gap versus dielectric constant for various oxides.
Figure 9:
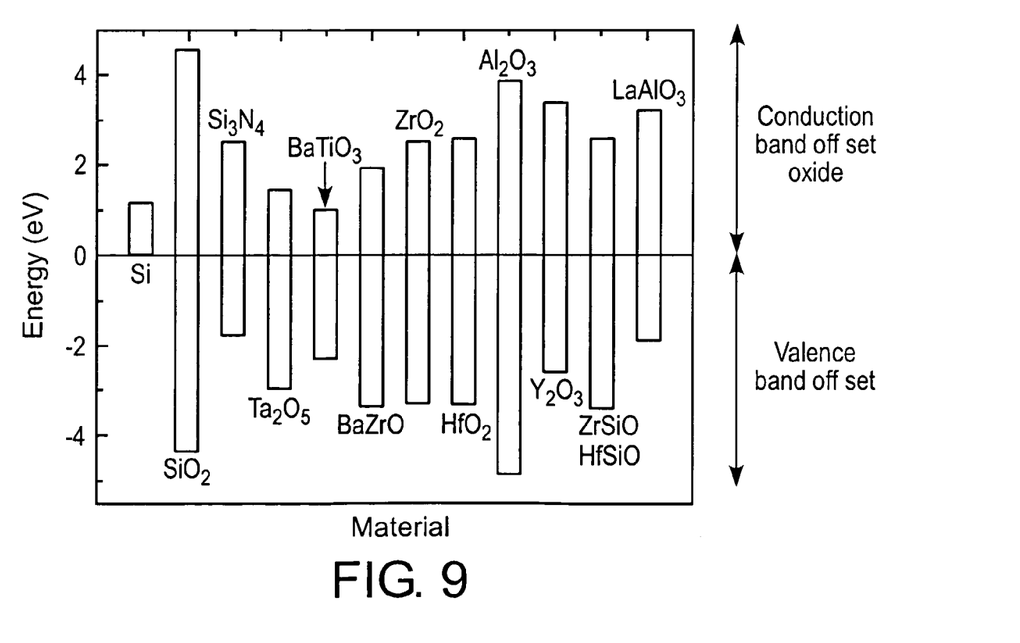
FIG. 9 illustrates the band alignment for various oxides.

The tunnel layer 52, 62 is preferably formed of a dielectric such as a thermal oxide, and even more preferably a dielectric is selected from the group consisting of $SiO_2$, $Al_2O_3$, MgO, SrO, SiN, BaO, TiO, $Si_3N_4$, $Ta_2O_5$, $BaTiO_3$, BaZrO, $ZrO_2$, $HfO_2$, $Al_2O_3$, $Y_2O_3$, ZrSiO, HfSiO, and $LaAlO_3$ The dielectric constant of some of these materials is shown in FIG. 8 and the band alignment of some other of these materials is shown in FIG. 9. Typical thickness is in the range of a few nanometers, e.g., 1-3 nm, and preferably 2 nm.

The material for charge trapping layer 53, 63 varies between the embodiments shown in FIGS. 5 and 6. In FIG. 5, the charge trapping layer is a floating gate, preferably made of a material selected from the group consisting of polysilicon, and high work-function metals such as platinum (Pt), gold (Au), titanium-aluminium alloy (TiAlN), and palladium (Pd) or a metal composite group consisting of metal nitride, metal boron nitride, metal silicon nitride, metal aluminium nitride and metal silicide.

High work-function metals may be preferred even for trapping dielectric 63 embodiments, especially for use of high k as a tunnelling dielectric 62. If the tunnel layer 62 comprises a high-k material, then the trapping dielectric gate 63 should be a high work-function metal or metal like material.

In FIG. 6, the charge trapping layer of 63 is a trapping dielectric, preferably made from a material selected from the group consisting of SiN, Si rich SiN, Si rich SiON, Si rich SiOx, Ge rich GeON, Ge rich GeN, Ge rich GeO, Si incorporated into GeO, Si incorporated into GeON, Si incorporated into GeN, Si incorporated into GeO, Ge incorporated into SiN. The trapping dielectric can be made of materials identified by either of the following formulas: 1. $M_1$ incorporated $M_2N$, $M_1$ incorporated $M_2ON$, $M_1$ incorporated $M_2Ox$, wherein $M_1$ and $M_2$ are different and $M_1$ and $M_2$ are metals, Si or Ge, and 2. M rich MNx, M rich MON, M rich MOx, wherein M is metal, Si or Ge.

The blocking layer 54, 64 is also a dielectric. The blocking dielectric 54, 64 is preferably a thermal oxide, and more preferably selected from a group of dialects consisting of $SiO_2$, $Al_2O_3$, MgO, SrO, SiN, BaO, TiO, $Si_3N_4$, $Ta_2O_5$, $BaTiO_3$, BaZrO, $ZrO_2$, $HfO_2$, $Al_2O_3$, $Y_2O_3$, ZrSiO, HfSiO, and $LaAlO_3$.

The control gate 55, 65 is a conductive material, preferably a metal, having a specific work function with more than 4.9 eV.

Figure 7A:
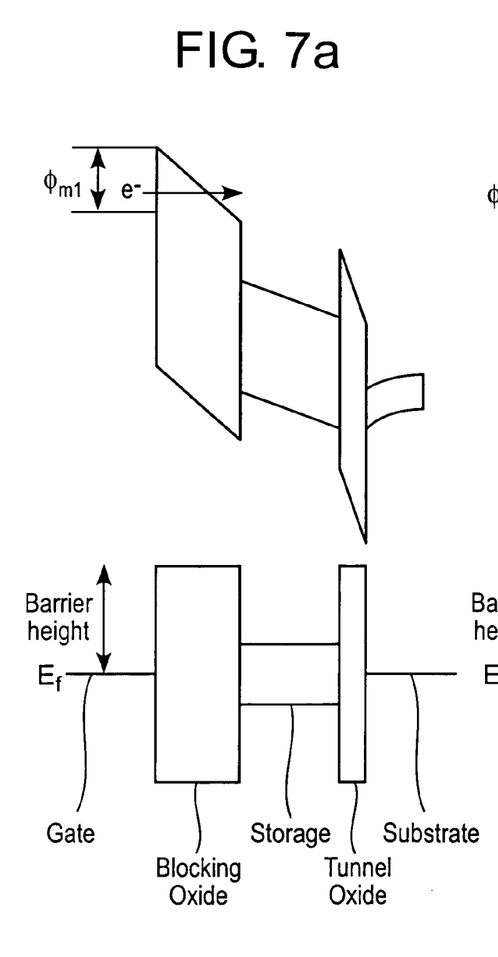
FIG. 7 graphically illustrates the effect of the invention on barrier height.
Figure 7B:
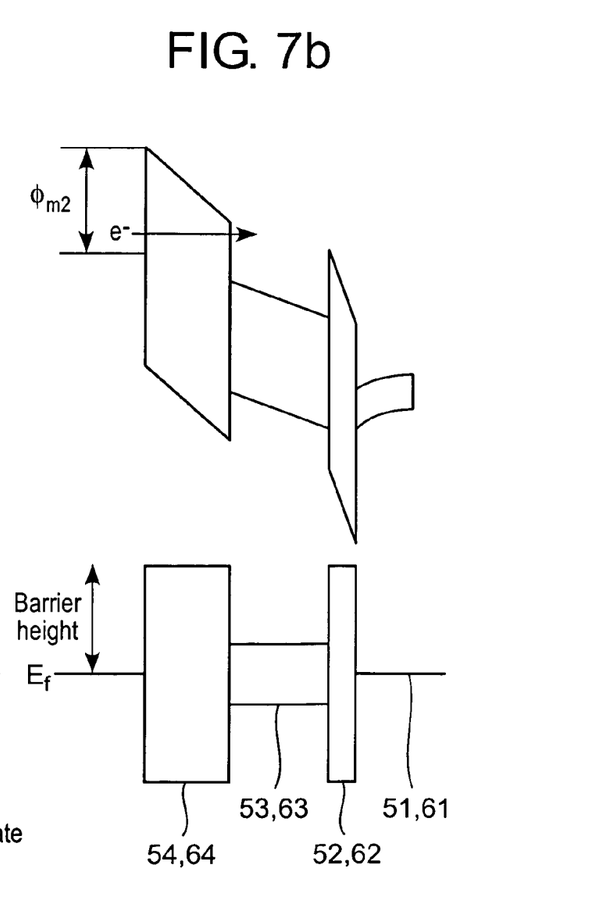

As explained with reference to FIGS. 7a and 7b, by increasing an absolute value of the work function of the control gate, a difference between the Fermi energy ($E_F$) of the metal gate layer 55, 65, for instance, and a conduction energy level (Ec) of the blocking dielectric layer 54, 64 increases relatively and, accordingly, it is possible to decrease the probability that electrons tunnel through the charge blocking layer 54, 64. As is illustrated in FIGS. 7(a) and 7(b), the energy band diagram of FIG. 7(a) illustrates a conventional n+-polysilicon gate structure. Electrons from the control gate can tunnel through the blocking oxide to the charge storage dielectric via Fowler-Nordheim (FN) tunneling. In contrast, as illustrated in FIG. 7(b), the energy band diagram of an alternative gate material in accordance with the present disclosure has a relatively larger electrical work function, resulting in a higher barrier height. Electrons from the gate must tunnel through the entire width of the blocking layer 54, 64 via Fowler-Nordheim tunneling. Fowler-Nordheim tunneling is defined as the current flowing across a MOS structure, for instance, at the high electric field in an oxide. The probability of Fowler-Nordheim tunneling has a relation to the width through which electrons tunnel. In most instances, this is thought of as the oxide thickness, as illustrated with respect to FIG. 2, for instance. The present embodiments disclosed herein, however, institutes longer Fowler-Nordheim tunneling through the selective use of high κ materials and metals having high work function.

Hence, by increasing the absolute value of the work function of a metal control gate, a difference between the Fermi energy ($E_F$) of the metal gate layer 55, 65, for instance, and the blocking dielectric layer 54, 64 increases, relatively. As the work function Φ of the metal goes up (and consequently the Fermi level $E_f$ of the metal goes down), the barrier height of the junction increases thereby decreasing the possibility of electrons tunneling through the charge blocking layer 54, 64. Consequently, it is possible to decrease the possibility of electrons tunneling through the charge blocking layer by selection of the dielectric layer of the blocking layer 54, 64 and the metal of the control gate 55, 65. In the disclosed embodiments of the present invention, electron back tunneling can be suppressed.

It should be noted that work function is generally defined as the minimum potential that the most loosely bound valence electrons in a solid must possess to be released to an outer vacuum when the kinetic energy is zero at absolute zero (0° C.).

Of the possible metals that could be used as a control gate, the following are listed along with their work function in brackets Hf [3.9], Zr [4.05], Ta [4.25], Al [4.28], Nb [4.3], Ti[4.33], W [4.55], Mo [4.6], Ru [4.71], Au [5.1], Ni [5.15], Ir [5.27] and Pt [5.65]. Of these, high work function metals would be preferred as materials used in these types semiconductor devices. It also should be noted that by high κ dielectric, it is generally understood to mean that κ is greater than or equal to 4.0 ($SiO_2$), and preferably higher than the κ value of polysilicon (4.1).

FIG. 8 illustrates the dielectric constant versus band gap for various oxides, including $SiO_2$, $Al_2O_3$, MgO, $HfO_2$, SrO, SiN, Ta$_2$O$_5$, BaO, and TiO$_2$. Of these, the intrinsic characteristics of charge trapping in the SiN are ideal for a charge trap flash memory device such as illustrated as memory device 60 of FIG. 6.

FIG. 9 illustrates the band alignment energy (eV) for various oxides where the conduction band offset of the oxide is shown as positive valence values and the valence band offset of oxides is shown as the negative values, of course, of various materials.

It should be evident from FIG. 8 that as the band gap of the oxide decreases with increases in the dielectric constant. The conduction band offset of the oxide is normally proportional to the band gap of the oxide. Equations not accounting for an electron back tunneling effect can be shown as follows:

Metal Work-Function=7.8–0.85*Barrier Height

Metal Work-Function=6.85–0.25*Band Gap

Thus, increasing barrier height has a direct relation to the band gap by selection of a metal work function.

Figure 10:
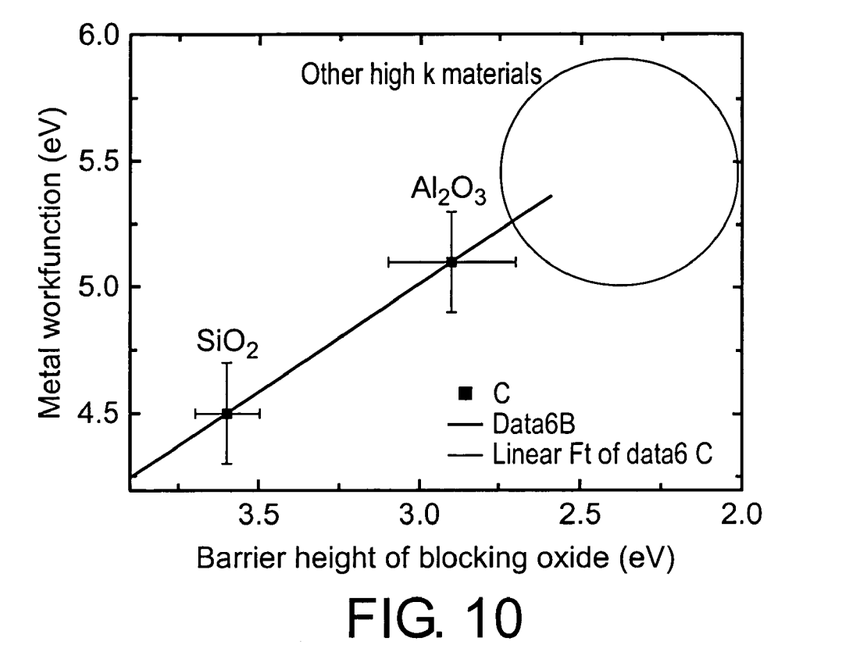
FIG. 10 illustrates metal work function versus dielectric constant.
Figure 11:
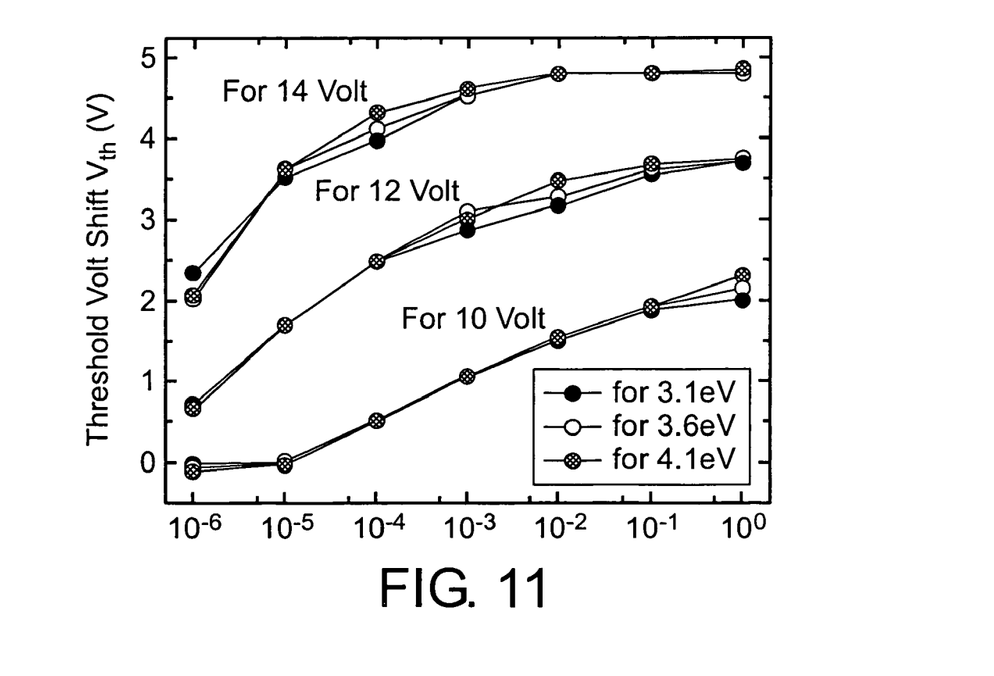
FIG. 11 illustrates programming characteristics.
Figure 12A:
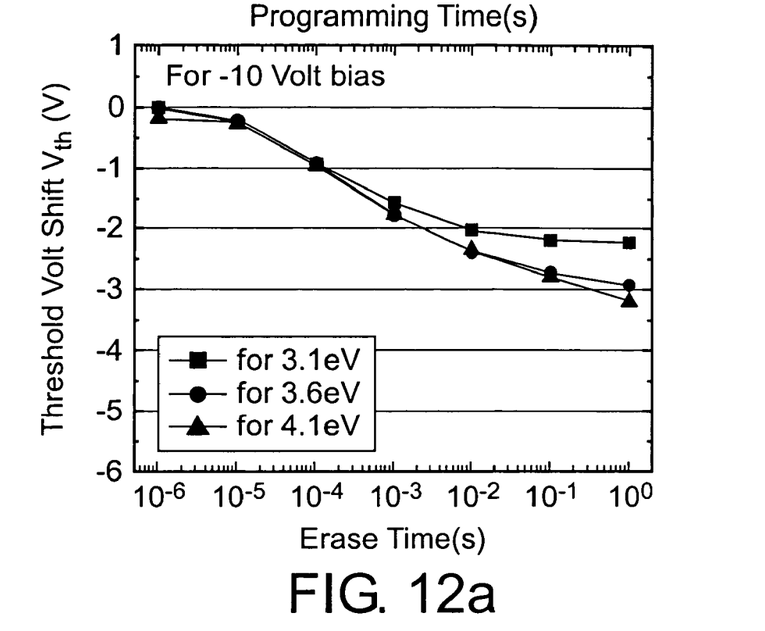
FIGS. 12(a), 12(b) and 12(c) illustrate the erasing characteristics −10 volts bias −12 volts bias and −14 volts bias, respectively.
Figure 12B:
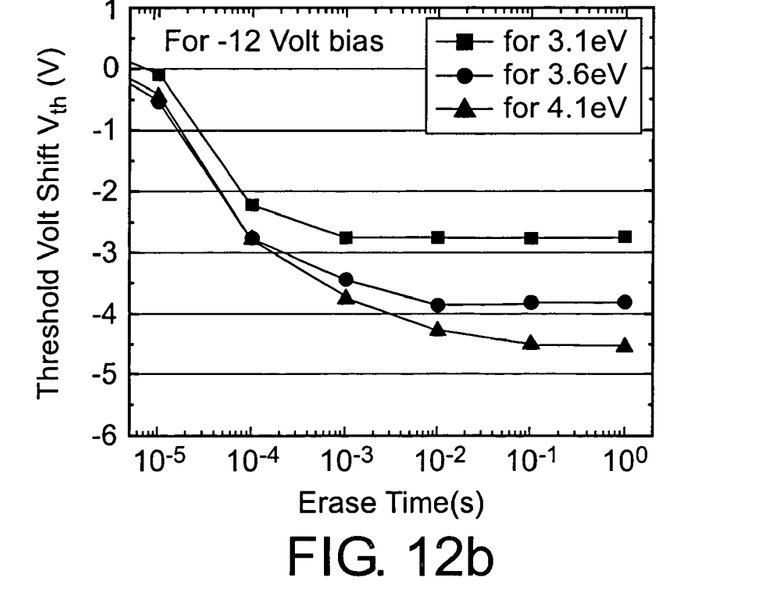
Figure 12C:
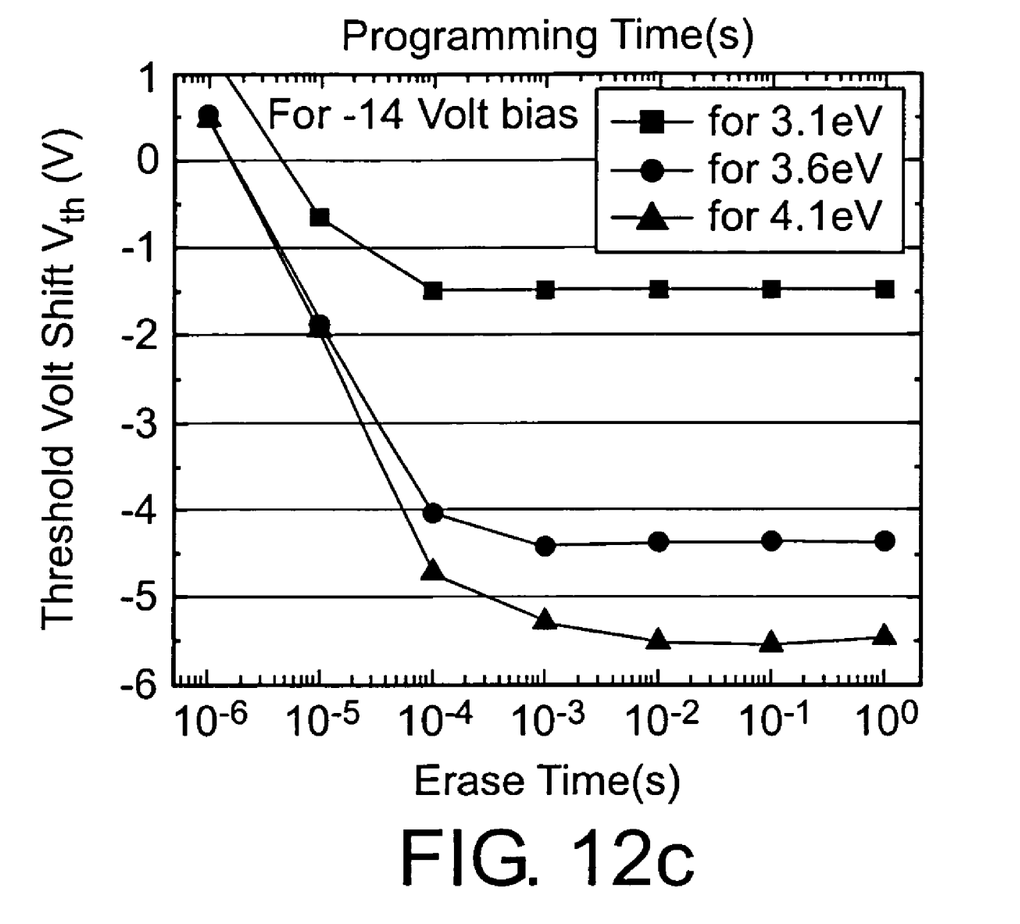

FIGS. 10 and 11 illustrate a principal characteristic of the present disclosure. As illustrated in FIG. 10, the metal work functions of various blocking oxides are shown versus dielectric constant. Here, SiO$_2$ and Al$_2$O$_3$ are illustrated as forming to a trend-line for the metal work function the barrier height of the blocking oxide decreases as the metal work function increases. For better program/erase characteristics, high k blocking dielectrics are preferred. As a consequence, higher work-function metal gates are preferably used when high k blocking dielectrics are used.

FIG. 11 illustrates the programming characteristics of an exemplary embodiment where the barrier height of a gate/SiO$_2$ blocking layer is illustrated. The barrier height of 3.1 eV for polysilicon/SiO$_2$ (add 1 eV to graph values to barrier heights show in the insert to represent the metal work function of 4.1 eV) for n+ polysilicon is demonstrated with the metal work function equal to 4.1 eV. Also, shown as the barrier height of 3.6 eV or metal work function of 4.6 eV and a barrier height of 4.1 eV for a metal work function of 5.1 eV. As illustrated in FIG. 11, variations occur as to 14 volt, 12 volt and 10 volt applied at the voltage shift $V_{th}$ for the various levels. Similarly, FIGS. 12(*a*), 12(*b*) and 12(*c*) show erasing characteristics of –10 bias, –12 bias and –14 bias, respectively, for the same barrier heights. As can be seen, for an erase time of $10^{-3}$ (sec), embodiments of the present invention appear to achieve through simulation programs the desired goal of a negative 3 volt threshold voltage particularly for negative 12 and negative 14 voltage biases. It should be noted that the threshold voltage $V_{th}$ equals the flat band voltage $V_{FB}$ plus 0.5 volts in the exemplary embodiments of the present invention.

Figure 13:
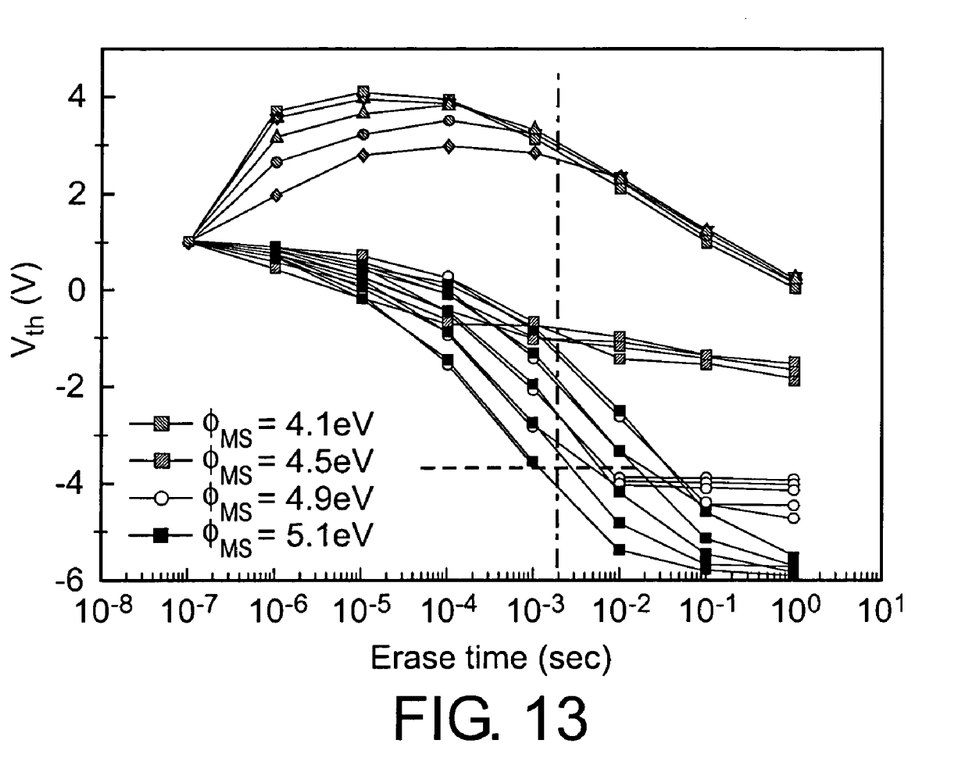
FIG. 13 illustrates the voltage threshold versus erase time of an O/SiN/H/M charge trapping non-volatile memory device in accordance with an exemplary embodiment of the present invention.

FIG. 13 is a graph of an exemplary O/N/H/M stack structure showing the threshold $V_{th}$ (V) versus erase time. The vertical chain-link line illustrates the erase time desired and demanded by industry. The horizontal dashed line illustrates the desired voltage threshold for erasing the non-volatile memory. As illustrated in FIG. 13, these desired results can be achieved for the various embodiments of the present invention according to computer simulations.

Specifically, when the blocking layer is principally comprised of SiO$_2$, the specific metal work function of a metal should be equal or greater than 4.4 eV. When the blocking layer is of a different high κ dielectric, i.e., a dielectric having a value of greater than 4.1, a specific metal work function of the control gate should be found in the range equal to or greater than 4.9 eV equal to or less than 5.5 eV, the upper limit for metals. It should be noted that these values are plus or minus 0.2 eV in most instances to reflect that some Fermi level pinning may occur due to impurities at the interface of the blocking layer 54, 64 and the metal control gate 55, 65.

With respect to another floating gate embodiment, the floating gate 52 is a metal gate comprised of a metal having a specific metal work function of equal or greater than 4.9 eV when the tunnel layer is a high κ dielectric. In this way, the erase and programming steps can be better controlled by increasing the barrier height of for electrons tunneling through the tunnel layer. For taking advantage of good retention property for use in high work-function floating gate and of good programming/erasing properties of high k tunneling layer, high work-function metal floating gate is preferred for this embodiment.

As should be clear from the above, the relatively recent introduction of high 1C dielectrics is gate dielectrics in the community as meant, until now, O/N/O devices were mainly used for SONOS-type flash memory device applications. By using p+ polysilicon gates and relatively thick blocking oxides, erasing problems could be mitigated. However, further scaling as design rules are reduced is inevitable, thereby increasing the demand for high κ dielectric materials. A problem is that high κ dielectrics are not compatible with p+ polysilicon due to the Fermi pinning effect as explained above, and regardless of the annealing temperature. Embodiments of the present invention avoid these problems by using a metal gate. For improving erasing efficiency and preventing electron backed tunneling, a high work-function metal gate is used.

It is predicted that a metal gate having a metal work function of 4.6 eV for O/N/O devices will meet the specifications for sub 52 or 57 nm flash memory devices without demonstrating any significant electron backed tunneling effect in a given erasing bias condition. A metal gate having a metal work function of 5.1 eV or O/N/H (where H stands for high κ dielectric) should meet the specification of sub 52 or 57 nm flash memory devices and should not show any significant electron backed tunneling effect for a given erasing bias condition. Hence, embodiments of the present invention can greatly mitigate the electron backed tunneling effect which is known to have been a serious problem for SONOS devices and the like.

According to simulations of embodiments of the present invention, a non-volatile semiconductor memory should have a program speed of 20 micro seconds at 17 V (with the threshold volt shift ($V_{th}$) going from –3V to 1V). The erase speed should be at 2 milliseconds at 18V (with the threshold volt shift ($V_{th}$) going from 1V to –3V). The on-cell current is preferably greater than 500 nA. The endurance (the change in the threshold volt shift) would be less than 0.3V at 100,000 cycles (for the program state). The cycling cell current would be greater than 350 nA at 100,000 cycles, and the retention (the change in the threshold volt shift) would be less than 0.3V at 250 degrees C. for 2 hours. Finally, the read disturb (the change in the threshold volt shift) would be less than 1V at 100,000 read cycles and at 10,000 program/erase cycles.

The present invention has been described by way of exemplary embodiments, to which it is not limited. Variations and modifications will occur to skilled artisans without departing from the scope of the present invention. For instance, embodiments of the present invention can achieve more scaling while maintaining or improving erase efficiency as compared with prior art, regardless of whether the high work-function metal gate is on an O/N/O, high κ stack of an O/N/H, O/H/H. O/H/O or H/H/H sequence in trapping dielectric embodiments, or O/FG/H, O/FG/O or H/FG/H sequence in floating gate (FG) embodiments.

What is claimed is:

1. A non-volatile semiconductor memory device, comprising:
   a substrate, said substrate including a source region, a drain region and a channel region provided between said source region and said drain region; and
   a gate stack located above said channel region, said gate stack including a sequential stack of a tunnel layer, a charge trapping layer, a charge blocking layer and a control gate, wherein said tunnel layer is adjacent to said channel region, and
   wherein said control gate is metal gate comprised of a metal having a specific metal work function in the range of equal or greater than 4.9 eV to equal or less than 5.5 eV,
   wherein the blocking layer is a high κ dielectric having a dielectric value above 4.2,
   wherein the memory device is a floating gate memory device and the charge trapping layer is a floating gate, and
   wherein said floating gate is a metal gate comprised of a metal having a specific metal work function of equal or greater than 4.9 eV, and
   wherein the tunnel layer is a high-κ dielectric.

2. The non-volatile semiconductor memory device of claim 1, wherein said gate stack comprises a multiple layer stack selected from a group of multiple layer stacks consisting of: O/N/O/M, O/N/H/M, O/H/H/M, O/H/O/M, H/H/H/M, or H/N/H/M, where O is an oxide material, N is SiN, H is a high κ material having a dielectric value above 4.1 and M is a metal having said specific work function.

3. The non-volatile semiconductor memory device of claim 1, wherein said tunnel layer is a dielectric selected from the group consisting of $SiO_2$, $Al_2O_3$, MgO, SrO, SiN, BaO, TiO, $Si_3N_4$, $Ta_2O_5$, $BaTiO_3$, BaZrO, $ZrO_2$, $HfO_2$, $Al_2O_3$, $Y_2O_3$, ZrSiO, HfSiO, and $LaAlO_3$.

4. The non-volatile semiconductor memory device of claim 1, wherein said floating gate comprising a material selected from the group consisting of platinum (Pt), gold (Au), titanium-aluminium alloy (TiAlN), and palladium (Pd) and a metal composite group consisting of metal nitride, metal boron nitride, metal silicon nitride, metal aluminium nitride and metal silicide.

5. The non-volatile semiconductor memory device of claim 1, wherein said substrate is a Si substrate.

* * * * *